(12) United States Patent
Fukui

(10) Patent No.: US 7,973,332 B2
(45) Date of Patent: Jul. 5, 2011

(54) LAMP AND METHOD OF MAKING THE SAME

(75) Inventor: Hiroyuki Fukui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 149 days.

(21) Appl. No.: 12/471,634

(22) Filed: May 26, 2009

(65) Prior Publication Data

US 2009/0296413 A1 Dec. 3, 2009

(30) Foreign Application Priority Data

| May 26, 2008 | (JP) | 2008-136627 |
| May 26, 2008 | (JP) | 2008-136628 |
| May 26, 2008 | (JP) | 2008-136629 |
| May 27, 2008 | (JP) | 2008-137411 |
| May 27, 2008 | (JP) | 2008-137876 |
| Jul. 2, 2008 | (JP) | 2008-173114 |

(51) Int. Cl.
*H01L 33/00* (2010.01)
(52) U.S. Cl. ............. 257/99; 257/82; 257/91; 257/685; 257/706; 257/E25.032; 362/800; 361/704; 361/729; 438/665; 438/964

(58) Field of Classification Search .................. None
See application file for complete search history.

(56) References Cited

U.S. PATENT DOCUMENTS

2010/0001395 A1 * 1/2010 Wang et al. ............. 257/706
2010/0037682 A1 * 2/2010 Xu ........................... 73/105

FOREIGN PATENT DOCUMENTS

JP 6-54103 7/1994

* cited by examiner

*Primary Examiner* — Evan Pert
*Assistant Examiner* — Scott Wilson
(74) *Attorney, Agent, or Firm* — Hamre, Schumann, Mueller & Larson, P.C.

(57) ABSTRACT

An LED lamp includes a board, a metal wiring provided on the board, an LED mounted on the metal wiring, and a metal heat dissipation film mainly made of a metal different from a metal for forming the metal wiring. The metal heat dissipation film partially overlaps the metal wiring. The metal heat dissipation film has an irregular surface. The metal heat dissipation film is mainly made of a metal that is softer than the metal wiring. The metal heat dissipation film intervenes between the board and the metal wiring, and part of the metal heat dissipation film that is in contact with the metal wiring has an irregular surface.

7 Claims, 12 Drawing Sheets

LAMP AND METHOD OF MAKING THE SAME

BACKGROUND OF THE INVENTION

1. Field of the Invention:

The present invention relates to an LED lamp which utilizes an LED as the light source and which is suitable for use as a replacement for a fluorescent lamp.

2. Description of the Related Art:

FIG. 21 is a sectional view showing an example of conventional LED lamp (see JP-U-6-54103, for example). The LED lamp X illustrated in the figure includes a substrate 91 in the form of an elongated rectangle, a plurality of LEDs 92 mounted on the substrate 91, a tube 93 accommodating the substrate 91, a terminal 94 and a circuit 95 for lighting the LEDs 92. The substrate 91 is formed with a non-illustrated wiring pattern connected to the LEDs 92 and the terminal 94. The LED lamp X is so designed that the LEDs 92 can be turned on by fitting the terminal 94 to a socket of general fluorescent lamp illuminators. Since the LED lamp 92 consumes low power and has a long life, the use of the LED lamp X as a replacement for fluorescent lamp is expected to have advantages in terms of cost and environment. Herein, the general fluorescent lamp illuminators mean illuminators which are widely used mainly for indoor lighting, and specifically, in Japan, e.g. illuminators which use a commercial power supply of 100V and which are so designed that a straight tube fluorescent lamp in accordance with JIS C7617 or an annular fluorescent lamp in accordance with JIS C7618 is to be mounted.

However, in the conventional LED lamp X, when the LEDs 92 are on for a long time, the LEDs 92 may be deteriorated due to the heat generated at the LEDs 92, which is not desirable.

The present invention is proposed under the circumstances described above. It is, therefore, an object of the present invention to provide an LED lamp and a method of making an LED lamp which are capable of promoting heat dissipation and preventing the deterioration of an LED.

SUMMARY OF THE INVENTION

An LED lamp provided according to a first aspect of the present invention includes a board, a metal wiring provided on the board, an LED mounted on the metal wiring, and a metal heat dissipation film mainly made of a metal that is different from the metal for forming the metal wiring. The metal heat dissipation film partially overlaps the metal wiring. The metal heat dissipation film has an irregular surface.

In a preferred embodiment of the present invention, the metal heat dissipation film is mainly made of a metal that is softer than the metal wiring.

In a preferred embodiment of the present invention, the metal heat dissipation film intervenes between the board and the metal wiring, and part of the metal heat dissipation film that is in contact with the metal wiring has an irregular surface.

A method of making an LED lamp provided according to a second aspect of the present invention includes the steps of: forming a metal wiring and a metal heat dissipation film on a board in a manner such that the metal wiring and the metal heat dissipation film partially overlap each other; and mounting an LED on the metal wiring. The formation of the metal heat dissipation film includes: forming a film of a metal that is different from the metal for forming the metal wiring; and performing implantation with respect to the film to make a surface of the film irregular.

In a preferred embodiment of the present invention, the metal wiring is mainly made of Cu. Preferably, the surface of the metal heat dissipation film is made irregular by adding an impurity to an aluminum film by implantation. Preferably, the impurity is selected from the group consisting of Ar, P and B.

Other features and advantages of the present invention will become more apparent from the detailed description given below with reference to the accompanying drawings.

DETAILED DESCRIPTION OF THE PREFERRED EMBODIMENTS

Figure 1:
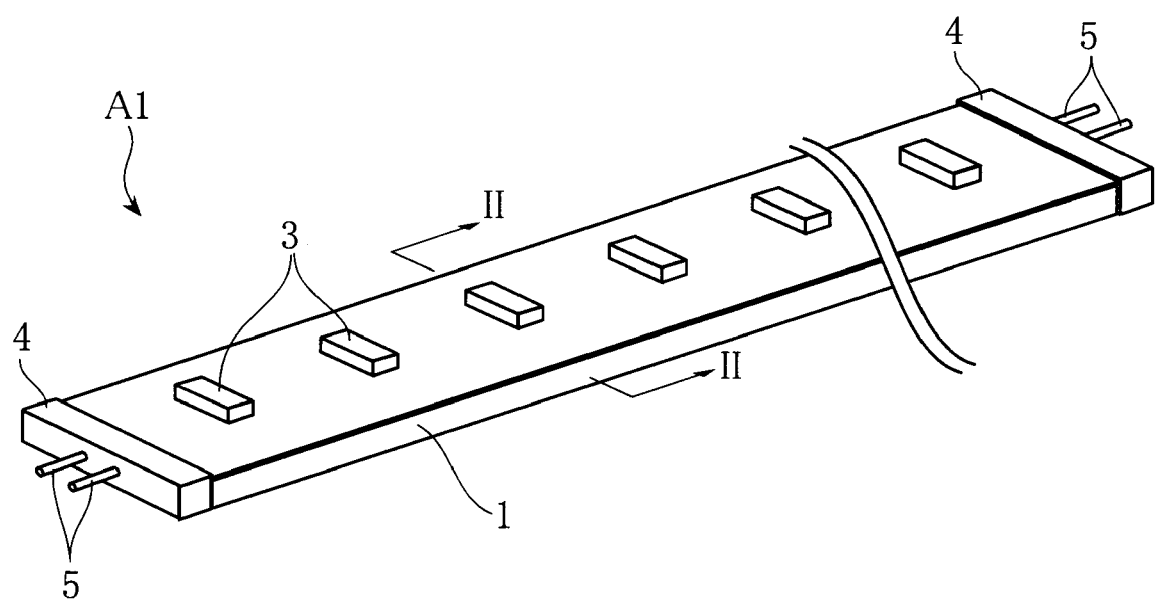
FIG. 1 is a perspective view showing an LED lamp according to a first embodiment of the present invention.
Figure 2:
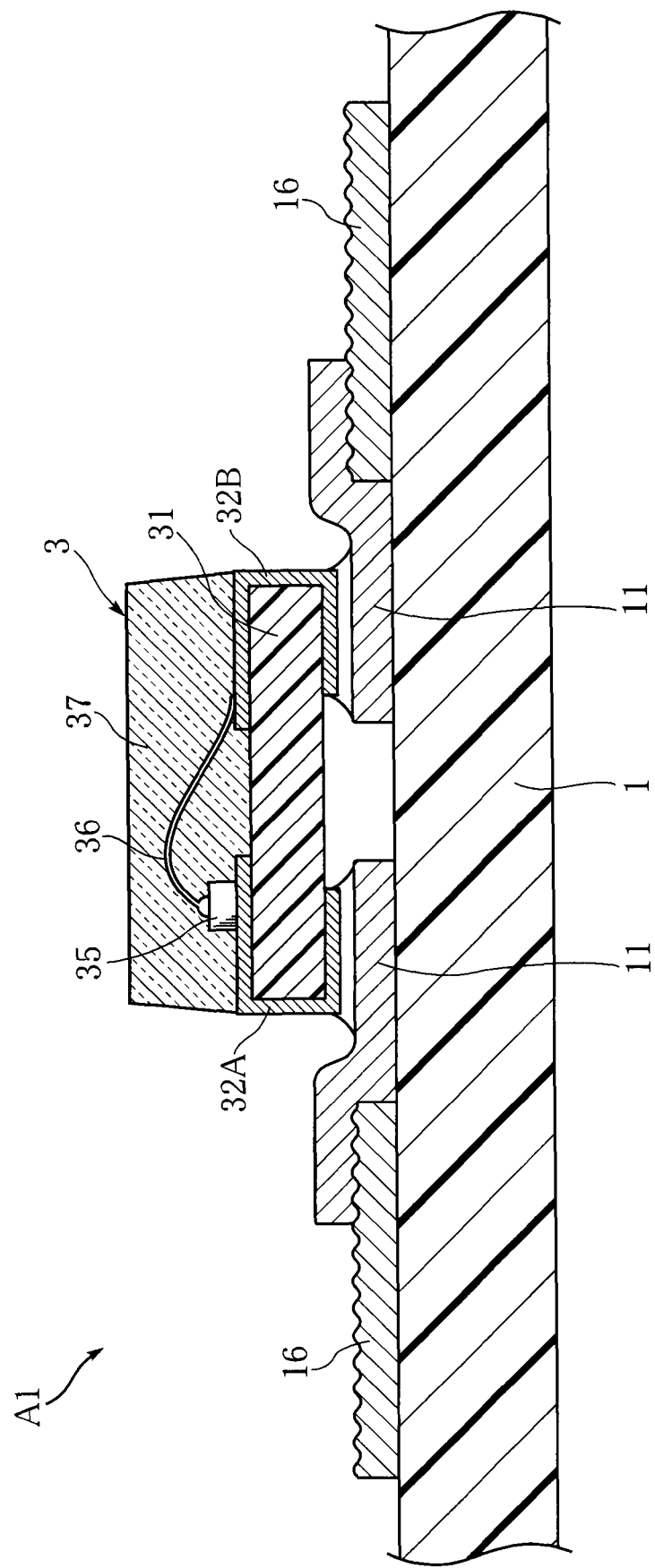
FIG. 2 is a sectional view taken along lines II-II in FIG. 1.

FIGS. 1 and 2 show an LED lamp according to a first embodiment of the present invention. The LED lamp A1 of this embodiment includes a board 1, metal heat dissipation films 16, metal wirings 11, a plurality of LED modules 3, caps 4 and terminals 5. The LED lamp A1 is accommodated in a non-illustrated cylindrical case and mounted to e.g. a general fluorescent lamp illuminator for use as a replacement for a fluorescent lamp. In FIG. 1, the illustration of the metal heat dissipation films 16 and the metal wirings 11 is omitted.

The board 1 is a printed wiring board in the form of a plate made of e.g. a glass fiber-reinforced epoxy resin. As shown in FIG. 2, the metal heat dissipation films 16 and the metal wirings 11 are formed on the board 1 to partially overlap each other. The board 1 is provided with a circuit (not shown) for lighting the LED modules 3.

Each of the metal heat dissipation films 16 is a thin metal film mainly made of a metal such as Al which is softer than the metal wirings 11. In FIG. 2, the metal heat dissipation film extends perpendicularly to the sheet surface. The thickness of the metal heat dissipation film 16 is e.g. 500 to 5,000 Å. The metal heat dissipation film 16 has an uneven, irregular obverse surface whose surface roughness is about 10 to 100 Å, for example. Such metal heat dissipation film 16 may be formed as follows. First, a film of Al is formed on the board 1 by sputtering. Then, ions of e.g. Ar, P or B are injected into the Al film by performing implantation at an acceleration voltage of about 30 to 200 KeV. As a result, the surface of the Al film becomes uneven. The surface roughness of the Al film can be adjusted by changing the acceleration voltage of the ion beam. Then, etching using a mask is performed to remove unnecessary portions. In this way, the metal heat dissipation film 16 with an irregular obverse surface is obtained.

The metal wirings 11 are provided for passing current to each of the LED modules 3 and extend perpendicularly to the sheet surface of FIG. 2. Each metal wiring 11 partially overlaps the corresponding metal heat dissipation film 16. The metal wiring 11 may be made by: forming a metal film by sputtering of a metallic material containing Cu as main component; and removing unnecessary portions of the film by etching with use of a mask. The paired metal wirings 11 are respectively connected to paired electrodes 34A and 34B of each LED module 3, which will be described later.

Each of the LED modules 3 includes a substrate 31, a pair of electrodes 34A, 34B, an LED chip 35, a bonding wire 36 and a resin package 7 and is designed as a package-type device for surface mounting. The substrate 31 is an insulating substrate made of e.g. a glass fiber-reinforced epoxy resin. The paired electrodes 34A and 34B are formed on two ends of the substrate 31 to be spaced from each other. Each of the electrodes covers a region of the substrate 31 which extends from the obverse surface to the reverse surface via a side surface. The electrodes 34A and 34B may be formed by successively laminating a plurality of plating layers at appropriate portions. The portions of the electrodes 34A and 34B which cover the reverse surface of the substrate 31 serve as mounting terminals utilized for surface-mounting the LED module 3.

The LED chip 35 is a light source of the LED lamp A1 and emits visible light such as blue light. The LED chip 35 may be a pn-type semiconductor device provided with an n-side electrode on the bottom surface. The n-side electrode is electrically connected to the electrode 34A via a non-illustrated silver paste. The LED chip 35 is further provided with a p-side electrode on the upper surface. The p-side electrode is electrically connected to the electrode 34B via the bonding wire 36. The resin package 37 protects the LED chip 35 and the bonding wire 36. The resin package 37 may be formed by molding a resin such as an epoxy resin which transmits the light emitted from the LED chip 35. When the LED chip 35 is designed to emit blue light, a fluorescent material which emits yellow light when excited by blue light may be mixed in the resin package 37 so that white light is emitted from the LED module 3. As the fluorescent material, use may be made of a mixture of a material which emits red light when excited by blue light and a material which emits green light when excited by blue light.

The LED module 3 having the above-described structure can be obtained by dividing an LED module aggregate in the form of a bar extending perpendicularly to the sheet surface of FIG. 2. The LED module 3 is bonded by positioning the electrodes 34A and 34B relative to the paired metal wirings 11 and performing soldering. In this embodiment, a plurality of LED modules 3 are arranged in a line extending perpendicularly to the sheet surface.

The caps 4 are attached to two ends of the board 1 which are spaced in the longitudinal direction of the board. The caps hold the terminals 5, respectively, and each of the terminals 5 is electrically connected to a respective one of the paired metal wirings 11. By fitting each of the terminals 5 to a socket of a fluorescent lamp illuminator, electric power is supplied to the LED modules 3 to turn on the LED chips 35.

The advantages of the LED lamp A1 are described below.

In the LED lamp A1 according to this embodiment, metal heat dissipation films 16 are provided to partially overlap the metal wirings 11. Thus, the heat generated in lighting the LED chip 35 is transferred to the metal heat dissipation films 16 through the metal wirings 11 for dissipation to the outside. Since the obverse surface of each metal heat dissipation film 16 is irregular, the surface area is large for the space which the film occupies, which enhances the heat dissipation effect. As a result, even when the LED lamp A1 is lit for a long time, deterioration of the LED modules 3 is suppressed. The LED lamp is suitable for use as a replacement for a fluorescent lamp.

In this embodiment, the main component of the metal heat dissipation films 16 is Al, which is softer than Cu for forming the metal wirings 11. Thus, it is relatively easy to make the obverse surface of the metal heat dissipation films 16 irregular. In this embodiment, the irregularities of the obverse surface of the metal heat dissipation films 16 are formed by implantation. With this technique, irregularities are properly formed even when the metal heat dissipation films 16 are thin.

Each of the metal heat dissipation films 16 intervenes between the board 1 and a respective one of the metal wirings 11, and the obverse surface of the metal heat dissipation film is irregular also at the portion held in contact with the metal wiring 11. Thus, the contact area between the metal heat dissipation film 16 and the metal wiring 11 is relatively large, so that an ohmic contact is properly formed at the contact portion. Thus, the wiring resistance can be reduced.

Figure 3:
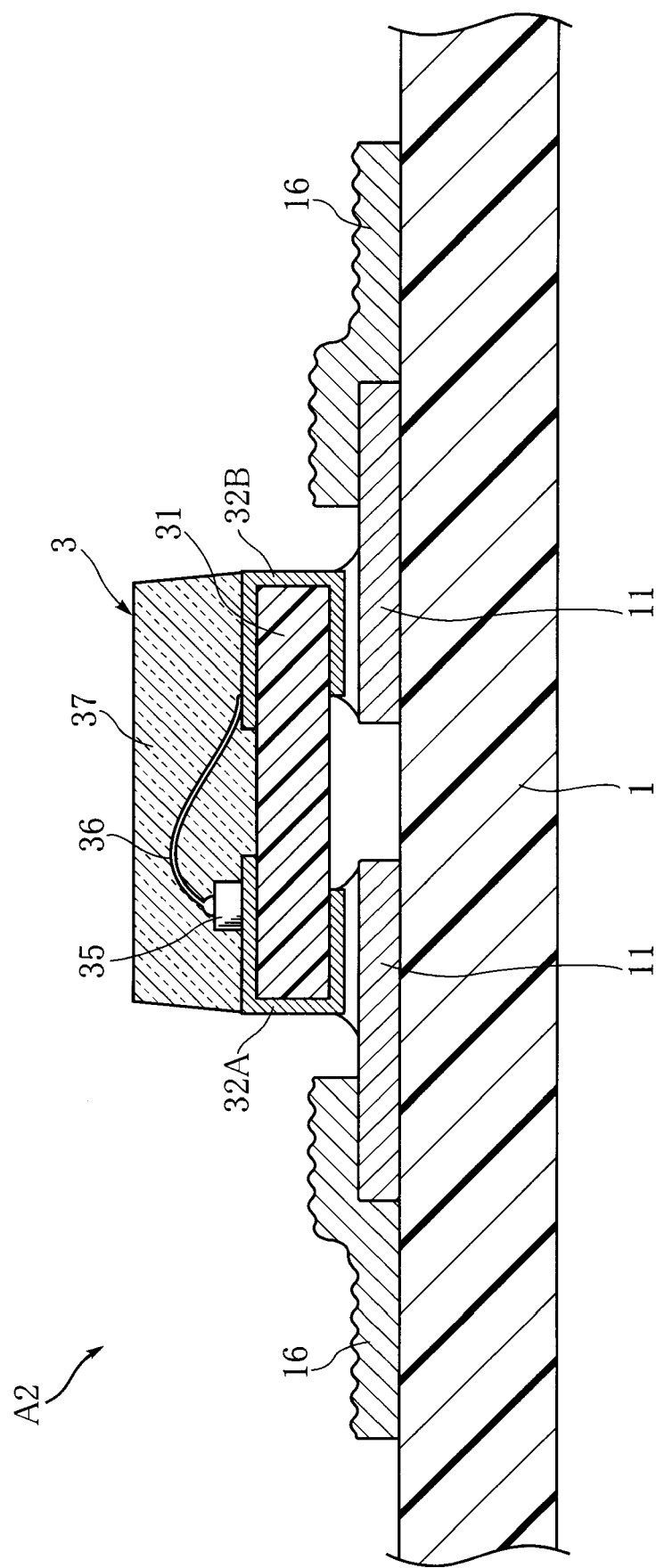
FIG. 3 is a sectional view showing an LED lamp according to a second embodiment of the present invention.
Figure 4:
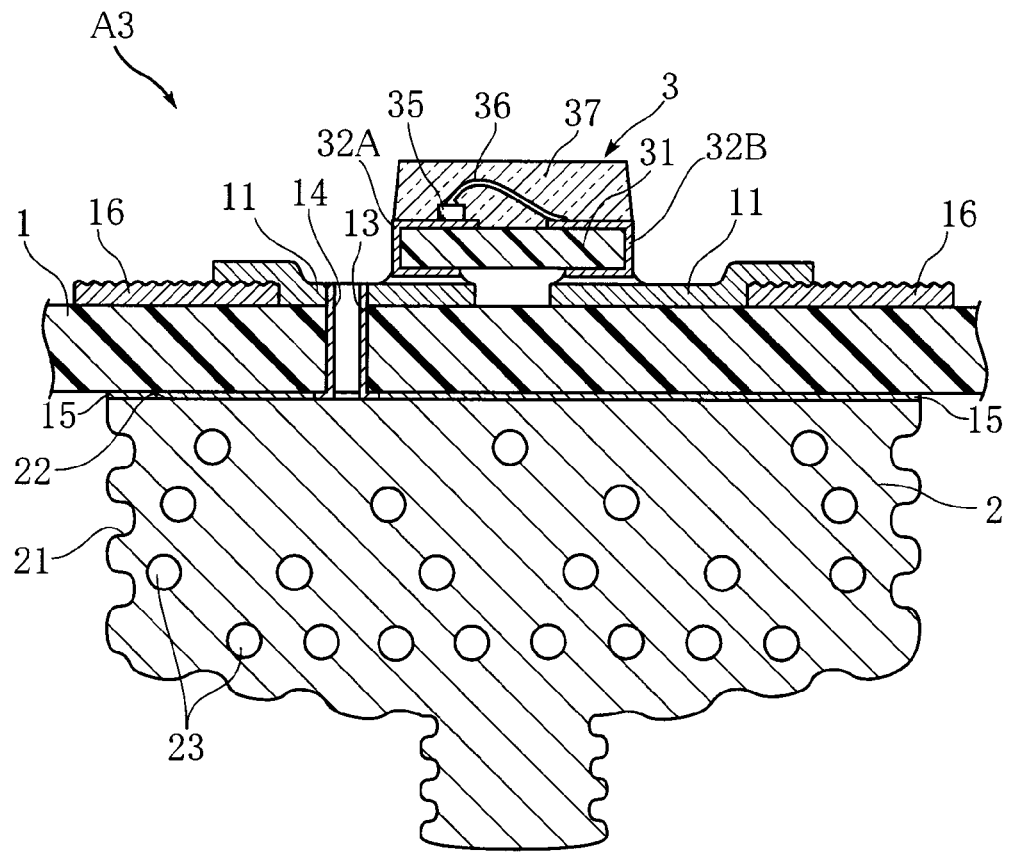
FIG. 4 is a sectional view showing an LED lamp according to a third embodiment of the present invention.

FIGS. 3 and 4 show an LED lamp according to a second embodiment of the present invention. In FIGS. 3 and 4, the elements which are identical or similar to those of the foregoing embodiment are designated by the same reference signs as those used for the foregoing embodiment, and the description is appropriately omitted.

The LED lamp A2 shown in FIG. 3 differs from that of the foregoing embodiment in that part of each metal heat dissipation film 16 is laminated on the corresponding metal wiring 11.

To make the LED lamp 2, metal wirings 11 and metal heat dissipation films 16 are successively formed on a board 1. Similarly to the foregoing embodiment, the metal wirings 11 are made by forming a metal film mainly made of Cu by sputtering, and then removing unnecessary portions of the film by etching with use of a mask. The metal heat dissipation films 16 are made by forming a film of e.g. Al by sputtering, performing implantation with respect to the Al film surface and then removing unnecessary portions of the film by etching using a mask. Then, LED modules 3 are mounted on the metal wirings 11.

In the LED lamp A2 according to this embodiment again, metal heat dissipation films 16 are provided to partially overlap the metal wirings 11. Thus, the heat generated in lighting the LED chip 35 is transferred to the metal heat dissipation films 16 through the metal wirings 11 for dissipation to the outside. Since the obverse surface of each metal heat dissipation film 16 is irregular, the surface area is large for the space which the film occupies, which enhances the heat dissipation effect. As a result, even when the LED lamp A1 is lit for a long time, deterioration of the LED modules 3 is suppressed. The LED lamp is suitable for use as a replacement for a fluorescent lamp.

FIG. 4 shows an LED lamp according to a third embodiment of the present invention. The LED lamp A3 of this embodiment differs from the LED lamp A1 of the foregoing embodiment in that a heat dissipation member 2 is additionally provided on a reverse surface of the board 1 and design change is made in accordance with the provision of the heat dissipation member.

In the LED lamp A3, the board 1 is formed with through-holes 13 penetrating the board and the metal wiring 11 in the thickness direction. Each of the through-holes 13 has an inner surface covered with a metal film 14. The reverse surface of the board 1 is formed with a metal film 15. The metal film 15 and the metal wiring 11 are electrically connected to each other via the metal film 14. The metal films 14 and 15 are made of e.g. Cu.

The heat dissipation member 2 is made of e.g. Al and in the form of an elongate block extending in the longitudinal direction of the board 1. The surface of the heat dissipation member 2 is formed with a plurality of recesses 21. The recesses 21 extend in the longitudinal direction of the board 1 throughout the length of the heat dissipation member 2. The recesses 21 can be provided by forming the heat dissipation member 2 by using a mold formed with projections. The heat dissipation member 2 is fixed to the reverse surface of the board 1 with e.g. screws. The upper surface 22 of the heat dissipation member 2 is held in contact with the metal film 15.

The heat dissipation member 2 is further formed with a plurality of air holes 23 each penetrating the heat dissipation member in the longitudinal direction of the board 1. The number of the air holes 23 is increasing as proceeding away from the board 1. Thus, the air hole ratio of the heat dissipation member 2 is lower at portions closer to the board 1 and higher at portions farther from the board 1.

In the LED lamp A3 of this embodiment, the heat generated in lighting the LED chip 35 is transferred also to the heat dissipation member 2 through the metal wirings 11 and the metal films 14, 15 for dissipation to the outside. Since the contact area of the heat dissipation member 2 with outside air is large due to the provision of the recesses 21 and air holes 23, the heat dissipation effect is high.

The LED lamp according to the present invention is not limited to the foregoing embodiments. The specific structure of each part of the LED lamp according to the present invention may be varied in design in many ways.

The material of the metal heat dissipation film is not limited to Al as described in the foregoing embodiments. The metal heat dissipation film may be made of other materials such as Mo or ITO (indium tin oxide). The LED is not limited to the package-type LED described in the foregoing embodiments. Instead, an LED bare chip may be mounted to the metal wiring. In this case, for example, a bare chip is bonded to one of the metal wirings 11, while the upper electrode of the bare chip is connected to the other metal wiring 11 via a bonding wire. Such bare chips and bonding wires may be collectively sealed by a transparent resin molding.

Figure 5:
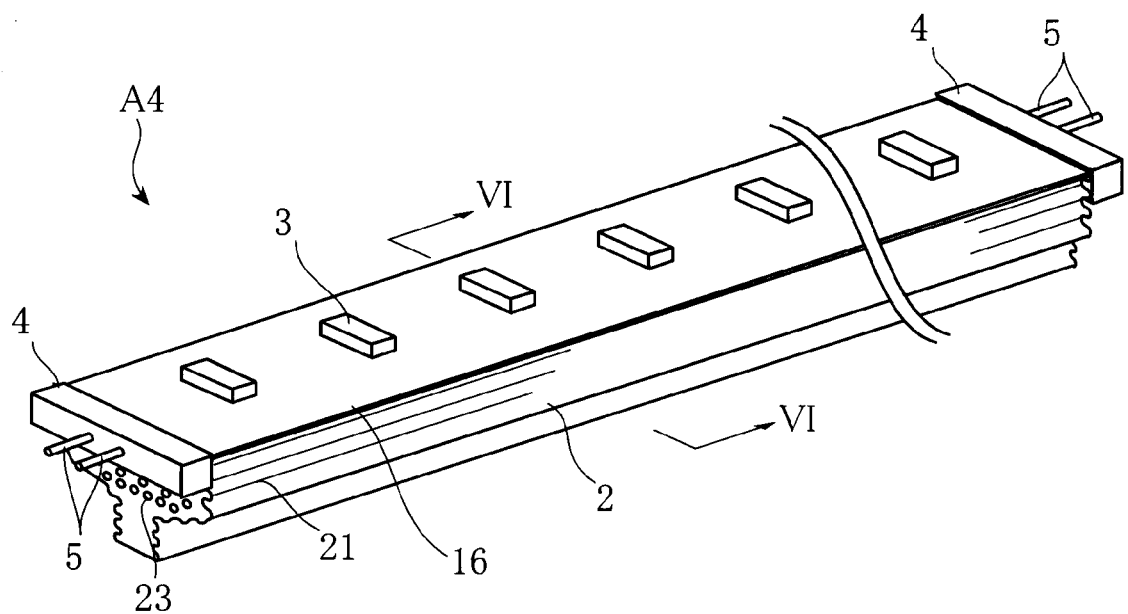
FIG. 5 is a perspective view showing an LED lamp according to a fourth embodiment of the present invention.
Figure 6:
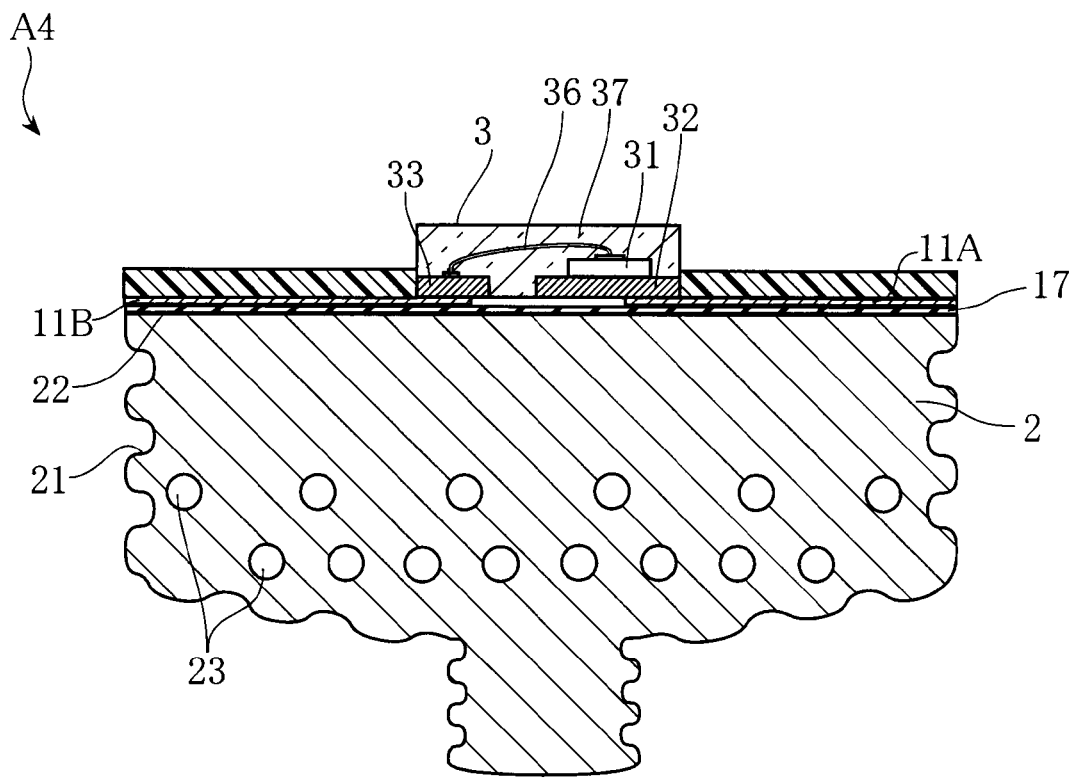
FIG. 6 is a sectional view taken along lines VI-VI in FIG. 5.

FIG. 5 shows an LED lamp according to a fourth embodiment of the present invention in perspective view. FIG. 6 is a sectional view taken along lines VI-VI in FIG. 5. The LED lamp A4 shown in FIGS. 5 and 6 includes a heat dissipation member 2, LED modules 3, caps 4 and terminals 5. The LED lamp A4 may be accommodated in a cylindrical case (not shown) for use as a replacement for a fluorescent lamp.

The heat dissipation member 2 is an elongate member made of e.g. Al. The heat dissipation member 2 includes recesses 21 and an upper surface 22. The recesses 21 are formed to increase the surface area of the heat dissipation member 2. The upper surface 22 are utilized for mounting LED modules 3 and so on. The heat dissipation member 2 is formed with a plurality of air holes 23 penetrating the heat dissipation member in the longitudinal direction. The air holes 23 are also formed to increase the surface area of the heat dissipation member 2.

An insulating layer 17 is formed on the entire upper surface 22 of the heat dissipation member 2. The insulating layer 17 is made of e.g. $SiO_2$. The thickness of the insulating layer 17 is e.g. 100 μm. The insulating layer 17 may be formed by CVD or PVD such as sputtering.

Metal wirings 11A and 11B, which are made of e.g. copper, are formed on the insulating layer 17. The metal wirings 11A and 11B may be made by forming a copper film on the insulating layer 17 and then etching the film. The metal wirings 11A and 11B are electrically insulated from the heat dissipation member 2 by the insulating layer 17.

LED modules 3 are arranged on the metal wirings 11A and 11B. Specifically, a plurality of LED modules 3 are mounted on the upper surface 22 of the heat dissipation member 2 in the longitudinal direction of the heat dissipation member 2. Each of the LED modules 3 includes an LED chip 35, leads 32 and 33 made of a metal and spaced from each other, a bonding wire 36 and a resin package 37.

The LED chip 35 has a laminated structure made up of an n-type semiconductor, a p-type semiconductor and an active layer sandwiched between the semiconductors. When the LED chip 35 is made of an AlGaIn-based semiconductor, the LED chip emits blue light. The LED chip 35 includes two electrodes. The electrodes are formed on the lower surface and the upper surface of the LED chip. The LED chip 35 is mounted on the lead 32. The lead 32 is connected to the metal wiring 11A. Thus, the electrode on the lower surface of the LED chip 35 is electrically connected to the metal wiring 11A. The electrode on the upper surface of the LED chip 35 is connected to the lead 33 via the bonding wire 36. The lead 33 is connected to the metal wiring 11B. Thus, the electrode on the upper surface of the LED chip 35 is electrically connected to the metal wiring 11B.

The resin package 37 protects the LED chip 35 and the bonding wire 36. The resin package 37 is made of an epoxy resin which transmits the light emitted from the LED chip 35. A fluorescent material which emits yellow light when excited by blue light may be mixed in the resin package 37. In this case, white light is emitted from the LED module 3. As the fluorescent material, use may be made of a mixture of a material which emits green light when excited by blue light and a material which emits red light when excited by blue light.

The caps 4 are attached to two ends of the heat dissipation member 2 which are spaced in the longitudinal direction. The caps hold the terminals 5, respectively, and each of the terminals 5 is electrically connected to a respective one of the metal wirings 11A and 11B. By fitting each of the terminals 5 to a socket of a fluorescent lamp illuminator, electric power is supplied to the LED modules 3 to turn on the LED chips 35.

The advantages of the LED lamp A4 are described below.

According to this embodiment, the heat generated at the LED chip 35 in lighting the LED lamp A4 is transferred to the metal wiring 11A through the lead 32. The heat transferred to the metal wiring 11A is transferred to the heat dissipation t member 2 through the insulating layer 17. Since the contact area of the heat dissipation member 2 with the outside is large because of the provision of the recesses 21 and the air holes 23, the heat dissipation member quickly dissipates the heat to the outside. In this way, in the LED lamp A4, the heat generated at the LED chip 35 is readily transferred to the heat dissipation member 2, and the heat readily dissipates from the heat dissipation member 2 to the outside. Thus, the temperature of the LED module 3 does not rise excessively so that the LED lamp A4 does not break easily.

The heat dissipation member 2 serves as a board to which the LED modules 3 are to be mounted. Thus, it is not necessary to prepare a board for mounting the LED module 3 in addition to the heat dissipation member 2.

The LED lamp A4 of this embodiment may be used for general fluorescent lamp illuminators. Herein, the general fluorescent lamp illuminators mean illuminators which are widely used mainly for indoor lighting, and specifically, in Japan, e.g. illuminators which use a commercial power supply of 100V or 200V and which are so designed that a straight tube fluorescent lamp in accordance with JIS C7617 or an annular fluorescent lamp in accordance with JIS C7618 is to be mounted.

The LED lamp according to the present invention is not limited to the foregoing embodiment. The specific structure of each part of the LED lamp according to the present invention may be varied in design in many ways. For instance, the thickness of the insulating layer 17 is not limited to 100 μm. The insulating layer 17 does not necessarily need to cover the entire upper surface 22. The insulating layer 17 may cover only part of the upper surface 22 so that the heat dissipation member 2 is partially exposed. Although the insulating layer 17 is formed on the upper surface 22 of the heat dissipation member 2 in this embodiment, the insulating layer 17 does not necessarily need to be formed on the upper surface 22. For instance, the side surface of the heat dissipation member 2, which is formed with recesses 21 in FIG. 6, may be made flat, and parts corresponding to the insulating layer 17 and the metal wirings 11B may be laminated on the flat side surface. In this case, the LED modules 3 may be directly mounted on the upper surface 22.

FIGS. 7-10 illustrate an LED lamp according to a fifth embodiment of the present invention. The LED lamp A5 of this embodiment includes a board 1, a heat dissipation member 2 and a plurality of LED modules 3. For easier understanding, the illustration of metal wirings 11, 12, metal layers 14, 15 and a protective layer 18 is omitted in FIGS. 7-9.

Figure 10:
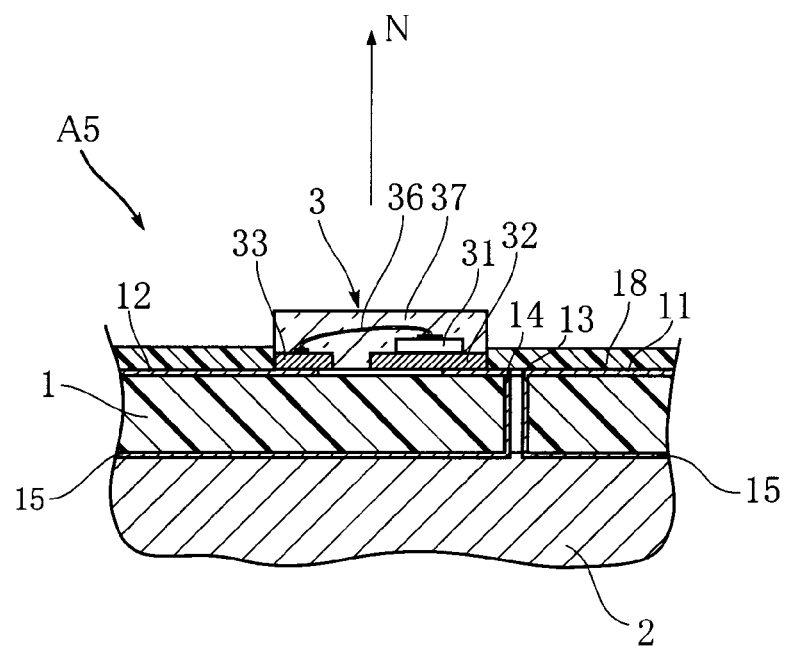
FIG. 10 is an enlarged sectional view taken along lines X-x in FIG. 7.

The board 1 is made of e.g. a glass fiber-reinforced epoxy resin and in the form of an elongated rectangle. As shown in FIG. 10, the board 1 is provided with metal wirings 11 and 12 formed on the obverse surface to be spaced from each other, a metal layer 15 formed on the reverse surface, a through-hole 13, a metal layer 14 covering the inner surface of the through-hole 13, and a protective layer 18 covering the metal wirings 11 and 12. The metal wiring 11 and the metal layer 15 are electrically connected to each other via the metal layer 14. The metal wirings 11, 12 and the metal layers 14, 15 are made of e.g. Cu. Unlike this embodiment, the board 1 may be made up of a base member made of e.g. Al, and an insulating film and a metal wiring laminated on the base member.

Figure 7:
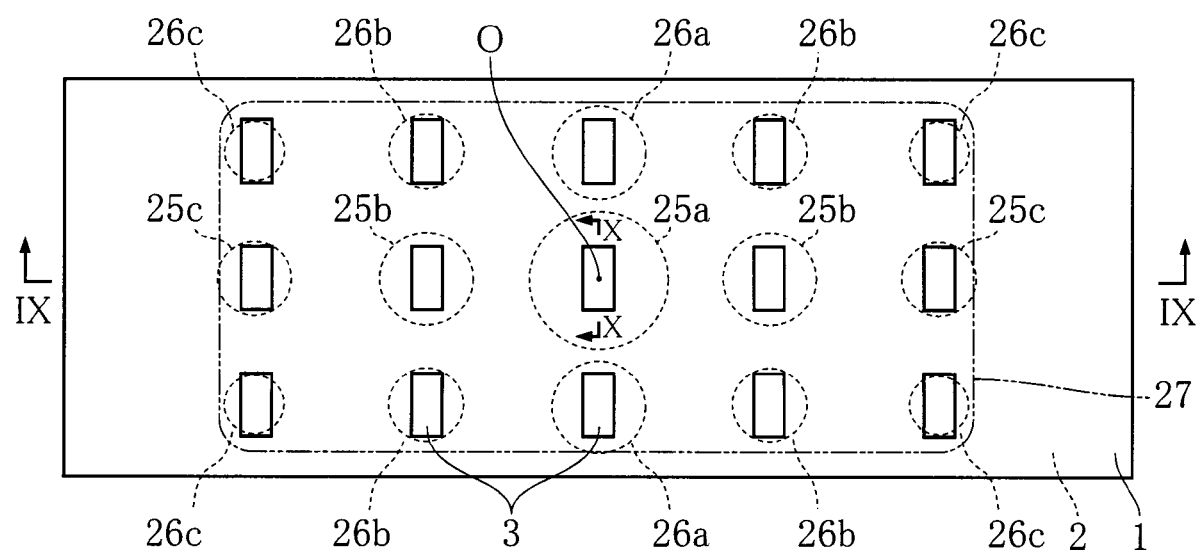
FIG. 7 is a plan view showing a principal portion of an LED lamp according to a fifth embodiment of the present invention.

The LED modules 3 are supported by the heat dissipation member 2 via the board 1 and so arranged that its main light emission direction N corresponds to the thickness direction of the board 1. As shown in FIG. 10, each of the LED modules 3 includes an LED chip 35, leads 32 and 33 made of a metal and spaced from each other, a bonding wire 36 and a resin package 37. As shown in FIG. 7, in this embodiment, the LED modules 3 are arranged in a substantially rectangular region 27 in a matrix of three rows and five columns. The LED lamp A5 is provided with a diffusion transmission cover (not shown) made of e.g. a milky white translucent resin. The light emitted from the LED modules 3 passes through the diffusion transmission cover in a diffusing manner. Thus, the LED lamp A5 illuminates the surroundings relatively uniformly.

The LED chip 35 may have a laminated structure made up of an n-type semiconductor layer, a p-type semiconductor layer and an active layer sandwiched between these layers. When the LED chip 35 is made of a GaN-based semiconductor, the LED chip emits blue light. The LED chip 35 is mounted on the lead 32. The upper surface of the LED chip 35 is connected to the lead 33 via the bonding wire 36. The lead 32 is connected to the metal wiring 11, whereas the lead 33 is connected to the metal wiring 12.

The resin package 37 protects the LED chip 35 and the bonding wire 36. The resin package 37 is made of e.g. an epoxy resin which transmits the light emitted from the LED chip 35. A fluorescent material which emits yellow light when excited by blue light may be mixed in the resin package 37. In this case, white light is emitted from the LED module 3. As the fluorescent material, use may be made of a mixture of a material which emits green light when excited by blue light and a material which emits red light when excited by blue light.

The heat dissipation member 2 is made of e.g. Al and made up of a plate 24 and a plurality of projections 25a, 25b, 25c, 26a, 26b and 26c. The plate 24 is bonded to the board 1 and supports the projections 25a, 25b, 25c, 26a, 26b and 26c.

Figure 8:
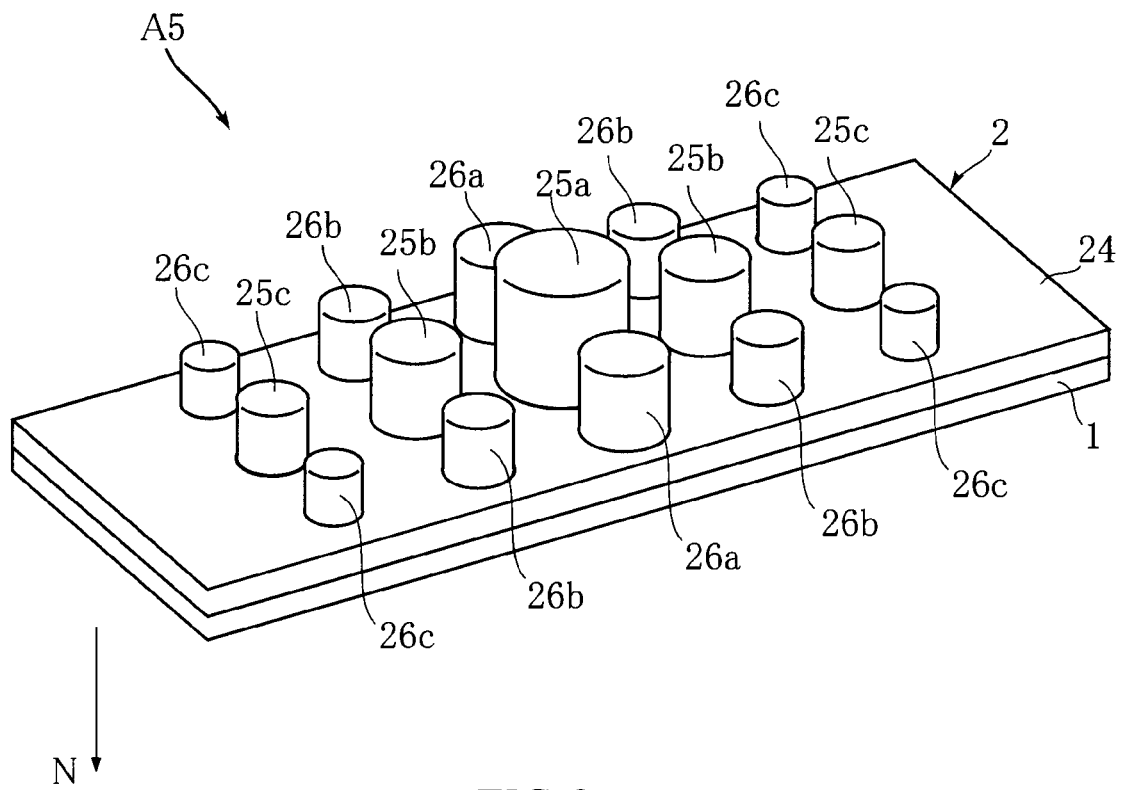
FIG. 8 is a perspective view showing an LED lamp of FIG. 7.
Figure 9:
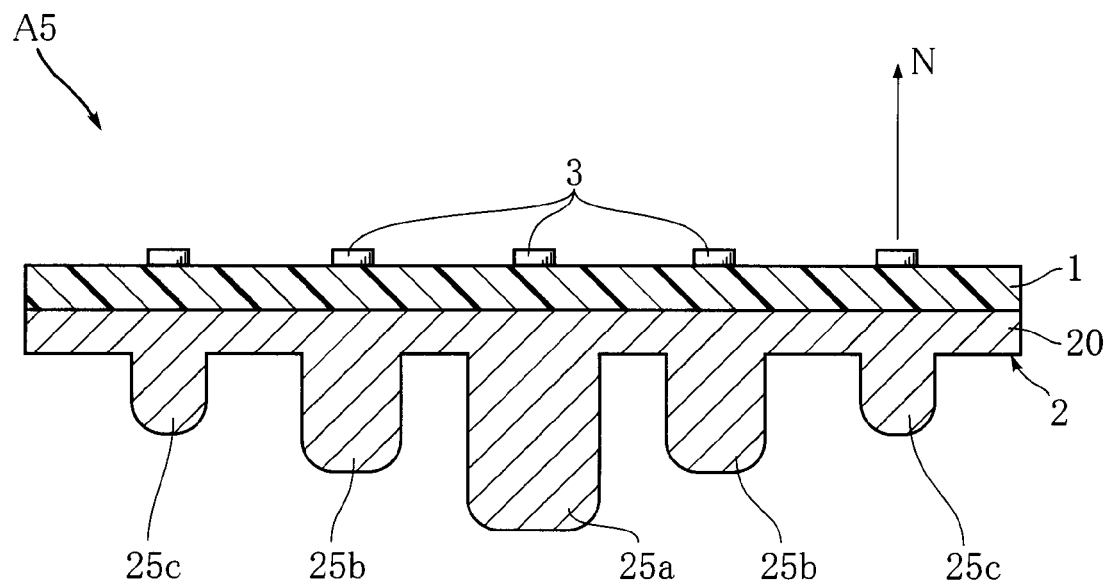
FIG. 9 is a sectional view taken along lines IX-IX in FIG. 7.

The projections 25a, 25b, 25c, 26a, 26b and 26c project from the plate 24 and extend away from the board 1. As shown in FIG. 7, the projections are arranged in a matrix to overlap the LED modules 3 as viewed in the main light emission direction N. As shown in FIGS. 7-9, the cross sections and heights of the respective projections 25a, 25b, 25c, 26a, 26b and 26c are greater as proceeding toward the center O of the region 27. For instance, as shown in FIG. 9, the cross section and height of the projection 25a at the center O are greater than those of the adjacent two projections 25b. On the other hand, the two projections 25c at the lateral extremities are smallest in cross section and height of the illustrated projections 25a, 25b and 25c.

The advantages of the LED lamp A5 are described below.

Since the LED modules 3 are arranged in a matrix, heat dissipation tends to be hindered more at positions closer to the center O of the region 27 by adjacent LED modules 3. In light of this, the projections 25a, 25b, 25c, 26a, 26b and 26c have a larger surface area at a position closer to the center O. Thus, as the LED module 3 is positioned closer to the center O, a larger amount of heat is dissipated through the projection 25a, 25b, 25c, 26a, 26b or 26c. As a result, uniform heat dissipation effect is obtained with respect to all of the LED modules 3, which leads to the uniform light emission amount and the prevention of unevenness of colors. The projections 25a, 25b, 25c, 26a, 26b and 26c are connected by the plate 24. Thus, the projections 25a, 25b, 25c, 26a, 26b and 26c can be stable, and further, excessive temperature rise at any of the projections 25a, 25b, 25c, 26a, 26b and 26c is prevented.

The LED lamp according to the present invention is not limited to the foregoing embodiment. The specific structure of each part of the LED lamp according to the present invention may be varied in design in many ways.

The heat dissipation member 2 does not necessarily need to include the plate 24 and may be made of the projections 25a, 25b, 25c, 26a, 26b and 26c only. The surface area of the projections of the present invention does not necessarily need to be increased by increasing the cross section and the height. For instance, the surface area may be increased by making the surface of the projections irregular. The LED chip in the present invention is not limited to one designed for an LED module and may be an LED chip to be directly bonded to a board. The LED lamp of the present invention can be designed to have various shapes such as those similar to a straight tube fluorescent lamp or an annular fluorescent lamp.

Figure 11:
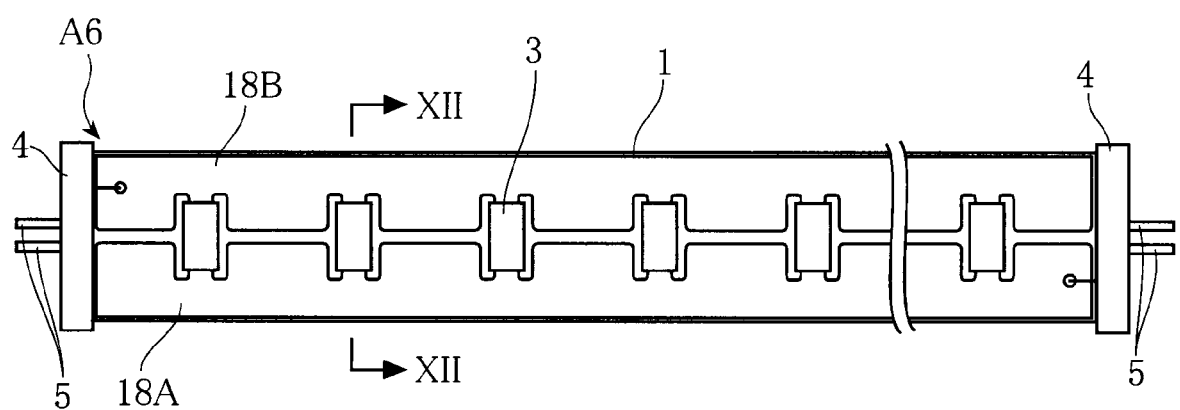
FIG. 11 is a plan view showing an LED lamp according to a sixth embodiment of the present invention.
Figure 12:
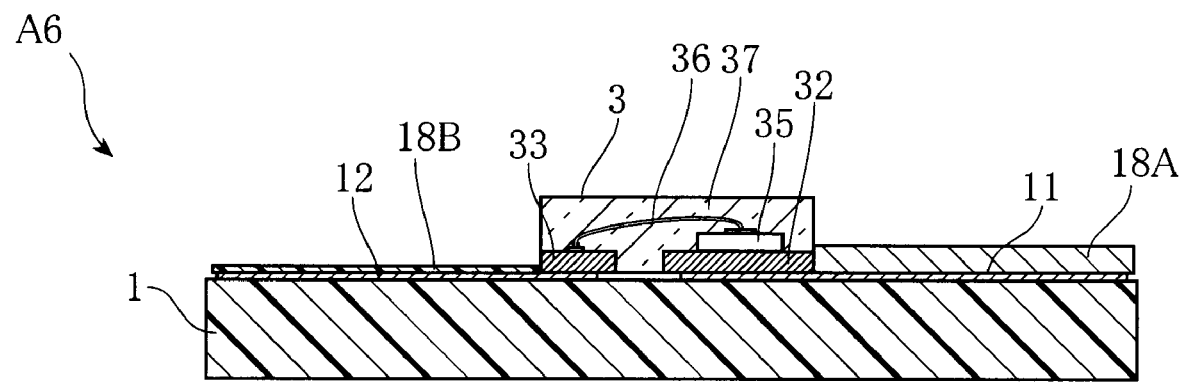
FIG. 12 is a sectional view taken along lines XII-XII in FIG. 11.

FIG. 11 shows an LED lamp according to a sixth embodiment of the present invention in plan view. FIG. 12 is a sectional view taken along lines XII-XII in FIG. 11. The LED lamp A6 shown in FIGS. 11 and 12 includes a board 1, a first protective layer 18A, a second protective layer 18B, LED modules 3, caps 4 and terminals 5. The LED lamp A6 is accommodated in a non-illustrated cylindrical case and mounted to e.g. a general fluorescent lamp illuminator for use as a replacement for a fluorescent lamp.

The board 1 is an insulating board made of e.g. a glass fiber-reinforced epoxy resin and in the form of an elongated rectangle. The obverse surface of the board 1 is formed with a first metal wiring 11, and a second metal wiring 12 spaced from the first metal wiring 11. The first metal wiring 11 is provided on one side of the board 1 in the width direction, whereas the second metal wiring 12 is provided on the other side of the board 1 in the width direction. The first and the second metal wirings 11 and 12 have a thickness of 18 μm to 70 μm and made of e.g. Cu.

The first protective layer 18A is laminated on the first metal wiring 11 to protecting the first metal wiring 11. The first protective layer is formed to cover one side of the board 1 in the width direction. The first protective layer 18A has a thickness of e.g. 0.5 mm and is made of solder. The formation of the first protective layer 18A may be made by solder printing. In this embodiment, the solder is an alloy mainly composed of e.g. Sn, Ag and Cu.

The second protective layer 18B is laminated on the second metal wiring 12 to protecting the second metal wiring 12. The second protective layer is formed to cover the other side of the board 1 in the width direction. The second protective layer 18B has a thickness of e.g. 18 μm and is made of e.g. resin.

Each of the LED modules 3 includes an LED chip 35, leads 32 and 33 made of a metal and spaced from each other, a bonding wire 36 and a resin package 37. The LED modules 3 are arranged in the longitudinal direction of the board 1. The LED modules 3 are so mounted that the main light emission direction of the LED chips 35 is perpendicular to the board 1.

The LED chip 35 has a laminated structure made up of an n-type semiconductor layer, a p-type semiconductor layer and an active layer sandwiched between these layers. When the LED chip 35 is made of an AlGaInP-based semiconductor, the LED chip emits blue light. The LED chip 35 is bonded to the lead 32. The upper surface of the LED chip 35 is connected to the lead 33 via the bonding wire 36. The lead 32 is fixedly connected to the first metal wiring 11, whereas the lead 33 is fixedly connected to the second metal wiring 12.

The resin package 37 protects the LED chip 35 and the bonding wire 36. The resin package 37 is made of e.g. an epoxy resin which transmits the light emitted from the LED chip 35. A fluorescent material which emits yellow light when excited by blue light may be mixed in the resin package 37. In this case, white light is emitted from the LED module 3. As the fluorescent material, use may be made of a mixture of a material which emits green light when excited by blue light and a material which emits red light when excited by blue light.

The caps 4 are attached to two ends of the board 1 which are spaced in the longitudinal direction of the board. The caps hold the terminals 5, respectively, and each of the terminals 5 is electrically connected to the first metal wiring 11 or the second metal wiring 12. By fitting each of the terminals 5 to a socket of a general fluorescent lamp illuminator, electric power is supplied to the LED modules 3 to turn on the LED chips 35.

The advantages of the LED lamp A6 are described below.

In this embodiment, since the first protective layer 18A is made of solder, the first protective layer dissipates heat more effectively than a conventional protective layer made of a resin. Thus, the heat generated at the LED chip 35 in lighting the LED lamp A6 is transferred to the first protective layer 18A through the lead 32 and the first metal wiring 11 and effectively dissipated to the outside through the surface of the first protective layer 18A. Since the LED lamp A6 has a structure capable of efficiently dissipating heat in this way, the temperature rise at the board 1 and the LED modules 3 is suppressed. Thus, the lamp does not break easily.

Figure 13:
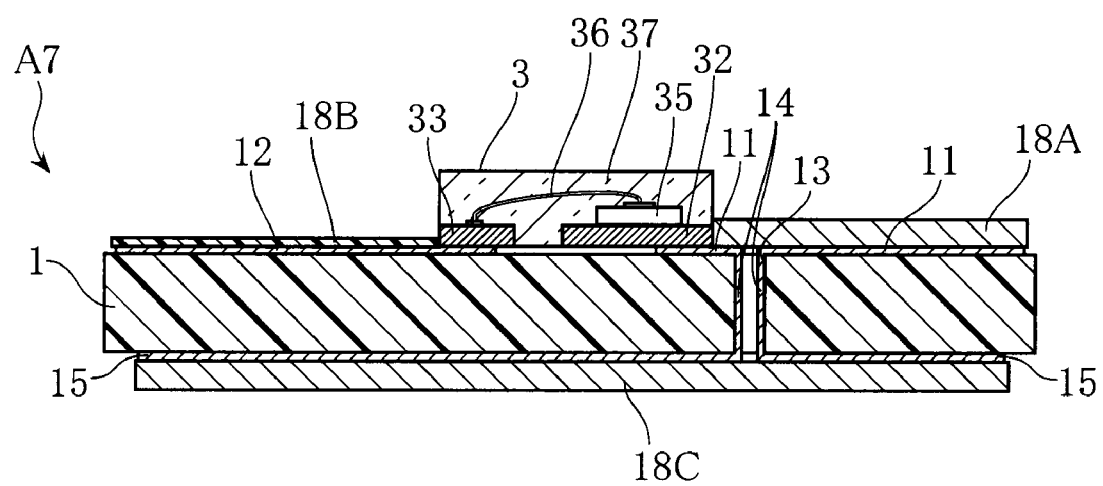
FIG. 13 is a sectional view showing an LED lamp according to a seventh embodiment of the present invention.

FIG. 13 shows an LED lamp according to a seventh embodiment of the present invention in sectional view. In addition to the same parts as those of the LED lamp A6, the LED lamp A7 shown in FIG. 13 includes a metal film 15 covering the reverse surface of the board 1, through holes 13, metal films 14 covering the inner surfaces of the through-holes 13, and a reverse surface protective layer 18C for protecting the metal film 15.

The plurality of through-holes are arranged in the longitudinal direction of the board 1. Each of the through-holes is formed on one side of the board 1 in the width direction and penetrates the board 1 in the thickness direction. Each of the metal films 14 is formed to cover a respective one of the through-holes 13 and connected to the first metal wiring 11 and the metal film 15.

Similarly to the first metal wiring 11 and the second metal wiring 12, the metal film 15 and the metal film 14 are made of Cu. The reverse surface protective layer 18C has a thickness of e.g. 0.5 mm and made of solder similarly to the first protective layer 18A.

In the LED lamp A7, the reverse surface protective layer 18C conducts more heat than the board 1. Thus, part of the heat generated at the LED chip 35 is transferred to the reverse surface protective layer 18C through the first metal wiring 11, the metal film 14 and the metal film 15 and dissipated to the outside. In the LED lamp A7, heat is dissipated more efficiently than in the LED lamp A6. Thus, the temperature rise of the board 1 and the LED module 3 is suppressed efficiently, so that the LED lamp A7 does not break easily.

Figure 14:
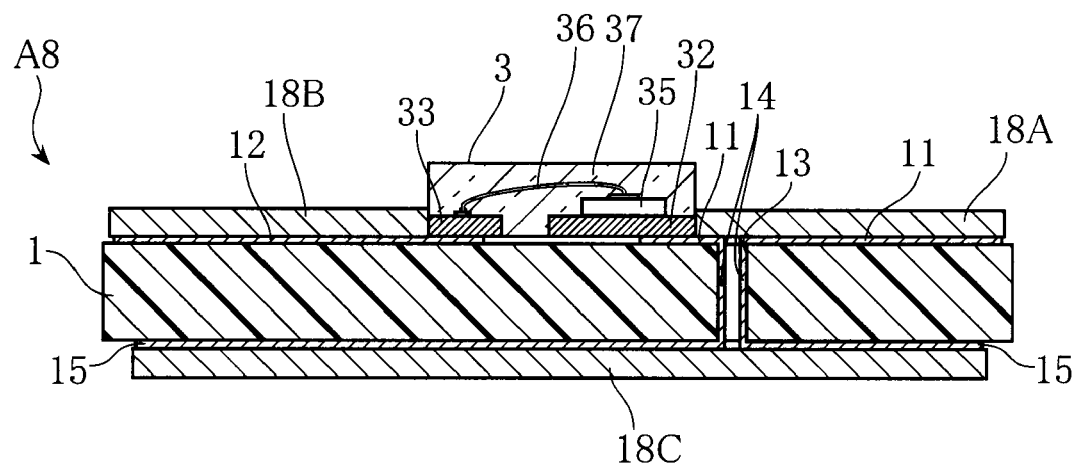
FIG. 14 is a sectional view showing an LED lamp according to an eighth embodiment of the present invention.

FIG. 14 shows an LED lamp according to an eighth embodiment of the present invention in sectional view. In the LED lamp A8 shown in FIG. 14, the second protective layer 18B is made of solder similarly to the first protective layer 18A. The structure of other parts are the same as that of the LED lamp A7.

The second protective layer 18B of the LED lamp A8 is spaced from the first protective layer 18A to be insulated from the first metal wiring 11 and the first protective layer 18A. The second protective layer 18B has a thickness of 0.5 mm.

In the LED lamp A8, part of the heat generated at the LED chip 35 is transferred to the second protective layer 18B through the bonding wire 36, the lead 33 and the second metal wiring 12 and dissipated to the outside through the surface of the second protective layer 18B. In the LED lamp A8 having this structure, heat is dissipated more efficiently than in the LED lamp A7. Thus, the temperature rise of the board 1 and the LED module 3 is suppressed efficiently, so that the LED lamp A8 does not break easily.

The LED lamp according to the present invention is not limited to the foregoing embodiment. The specific structure of each part of the LED lamp according to the present invention may be varied in design in many ways. For instance, although the board in the foregoing embodiment is in the form of an elongated rectangle, a circular board may be employed. The thickness of the first protective layer 18A, the second protective layer 18B and the reverse surface protective layer 18C can be varied appropriately in accordance with the size of the board 1.

Figure 15:
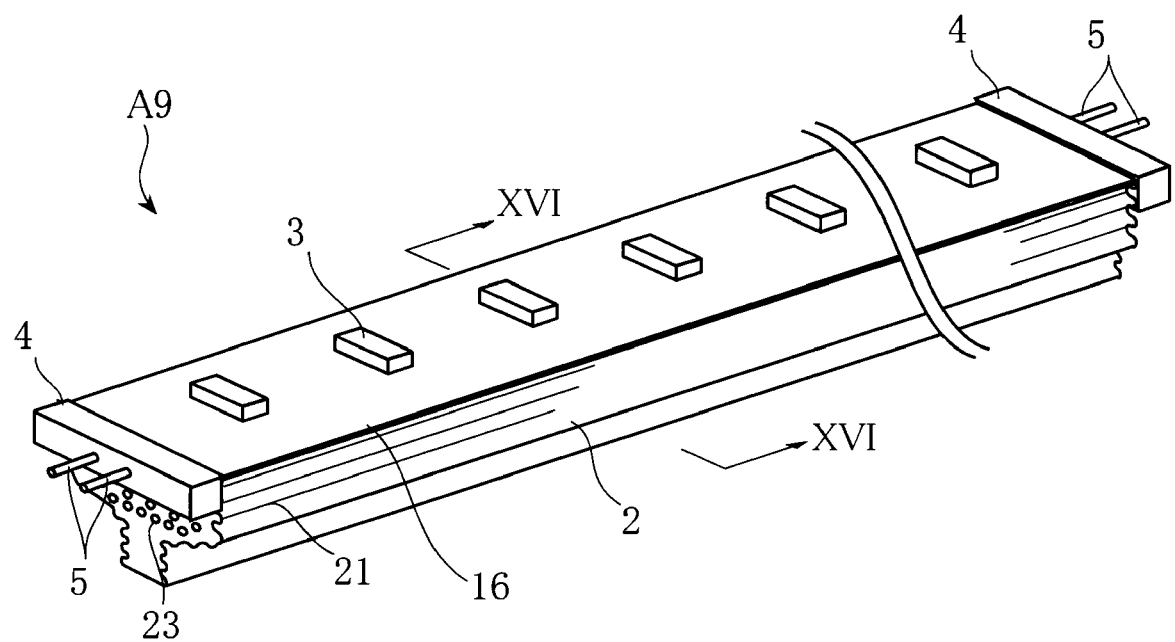
FIG. 15 is a perspective view showing an LED lamp according to a ninth embodiment of the present invention.
Figure 16:
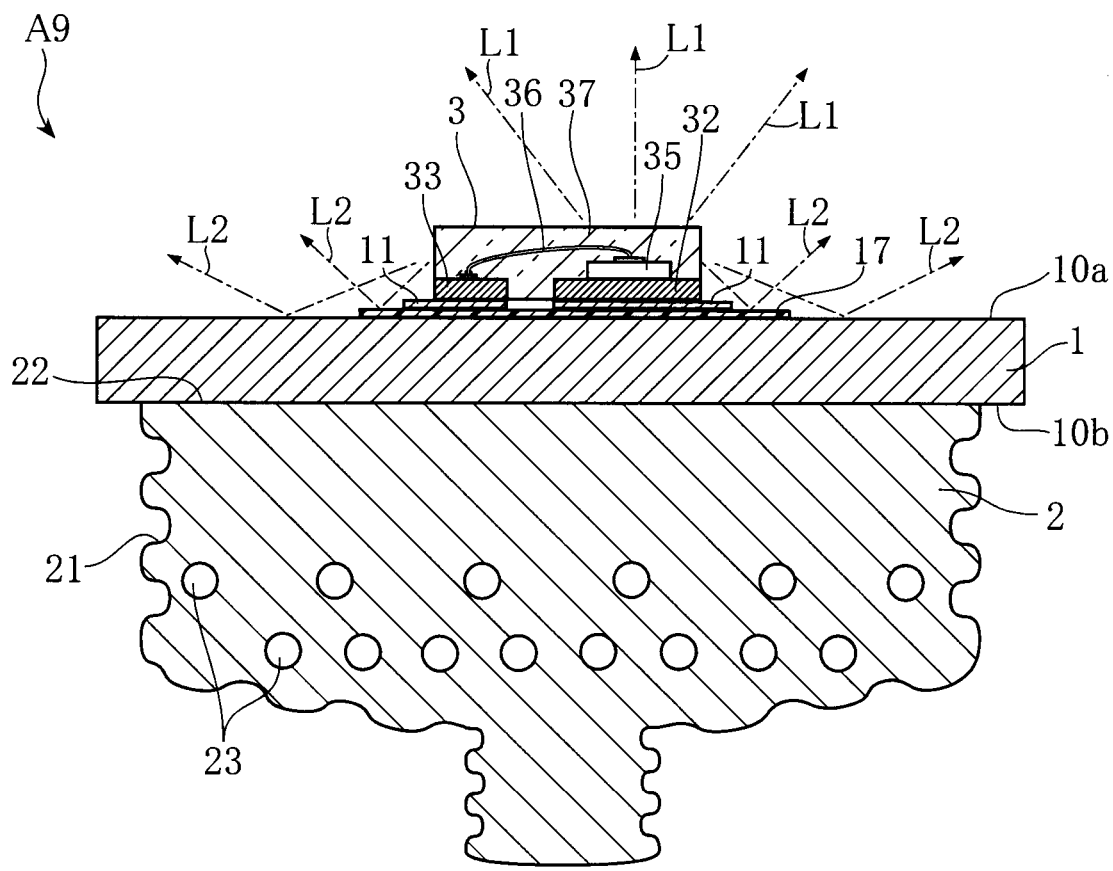
FIG. 16 is a sectional view taken along lines XVI-XVI in FIG. 15.

FIGS. 15 and 16 show an LED lamp according to a ninth embodiment of the present invention. The LED lamp A9 of this embodiment includes a board 1, a heat dissipation member 2, LED modules 3, caps 4 and terminals 5. The LED lamp A9 is accommodated in a non-illustrated cylindrical case and mounted to e.g. a general fluorescent lamp illuminator for use as a replacement for a fluorescent lamp.

The board 1 is made of e.g. Si, and has a thickness of 1 mm or less in the form of an elongated rectangle. The obverse surface 10a of the board 1 is smooth like a mirror, which can be provided by grinding and then dividing a Si wafer as a material board. On the obverse surface 10a of the board 1, metal wirings 11 (not illustrated in FIG. 15) are provided via an insulating layer 17. The insulating layer 17 is made of e.g. $SiO_2$ and prevents a short circuit between the board land the metal wirings 11. The metal wirings 11 are made of e.g. Cu. The LED modules 3 are electrically connected to the metal wiring 11. The heat dissipation member 2 is bonded to the reverse surface 10b of the board 1.

The heat dissipation member 2 is made of e.g. Al and elongate in the longitudinal direction of the board 1. A plurality of recesses 21 and air holes 23 for enhancing heat dissipation are formed at the surface or in the interior of the heat dissipation member 2. With the provision of the heat dissipation member 2, the heat generated at the LED chip 35 in lighting the lamp is transferred to the metal wirings 11 and the insulating layer 17 through the lead 32 and further transferred to the heat dissipation member 2 through the board 1. Since the heat dissipation member 2 is formed with recesses 21 and air holes 23, the contact area with outside air is large. Thus, the heat transferred to the heat dissipation member 2 is quickly dissipated.

Each of the LED modules 3 includes an LED chip 35, leads 32 and 33 made of a metal and spaced from each other, a bonding wire 36 and a resin package 37. The LED modules 3 are mounted to the obverse surface 10a of the board 1 by e.g. soldering to the metal wirings 11. The LED modules 3 are arranged in the longitudinal direction of the board 1.

The LED chip 35 may have a laminated structure made up of an n-type semiconductor layer, a p-type semiconductor layer and an active layer sandwiched between these layers. When the LED chip 35 is made of a GaN-based semiconductor, the LED chip emits blue light. The LED chip 35 is bonded to the lead 32. The upper surface of the LED chip 35 is connected to the lead 33 via the bonding wire 36. The leads 32 and 33 are respectively connected to wirings 11 which are spaced from each other. The resin package 37 is made of e.g. an epoxy resin which transmits the light emitted from the LED chip 35 and protects the LED chip 35 and the bonding wire 36. A fluorescent material which emits yellow light when excited by blue light may be mixed in the resin package 37. In this case, white light is emitted from the LED module 3. As the fluorescent material, use may be made of a mixture of a material which emits green light when excited by blue light and a material which emits red light when excited by blue light.

The caps 4 are attached to two ends of the board 1 which are spaced in the longitudinal direction of the board. The caps hold the terminals 5, respectively, and each of the terminals 5 is electrically connected to one of the metal wirings 11. By fitting each of the terminals 5 to a socket of a fluorescent lamp illuminator, electric power is supplied to the LED modules 3 to turn on the LED chips 35.

The advantages of the LED lamp A9 are described below.

According to this embodiment, the light emitted from the LED chip 35 in lighting the LED lamp A9 passes through the resin package 37 and travels in all directions. For instance, the light L1 traveling from the LED chip 35 to the upper side of the substrate 1 passes through the non-illustrated case to the outside.

Another part of the light L2 emitted from the LED chip 35 exits the resin package 37 downwardly or is reflected at the inner surface of the case and then travels toward the obverse surface 10a of the board 1. The light L2 is reflected at the obverse surface 10a of the board 1 directly or after passing through the insulating layer 17. The light reflected at the obverse surface 10a of the board 1 travels to the upper side of the board 1 and finally passes through the non-illustrated case to the outside.

At the obverse surface 10a of the board 1, mirror reflection of light occurs. Thus, as the entire LED lamp A9, in addition to the light traveling directly from the LED chip 35 to the outside through the case, a relatively large amount of light is emitted due to mirror reflection. Thus, the LED lamp A9 has a high brightness even when the number of LED modules 3 mounted on the board 1 is not so large. Thus, according to this embodiment, the LED lamp A9 having a high brightness is provided while reducing the cost by reducing the number of LED modules 3.

The present invention is not limited to the foregoing embodiment. The specific structure of each part of the LED lamp according to the present invention may be varied in design in many ways. For instance, although it is preferable that the board is made of a metal which can provide a mirror surface, the board may not be made of a metal. In this case, a metal film having a mirror surface may be provided on the surface of the board.

Figure 17:
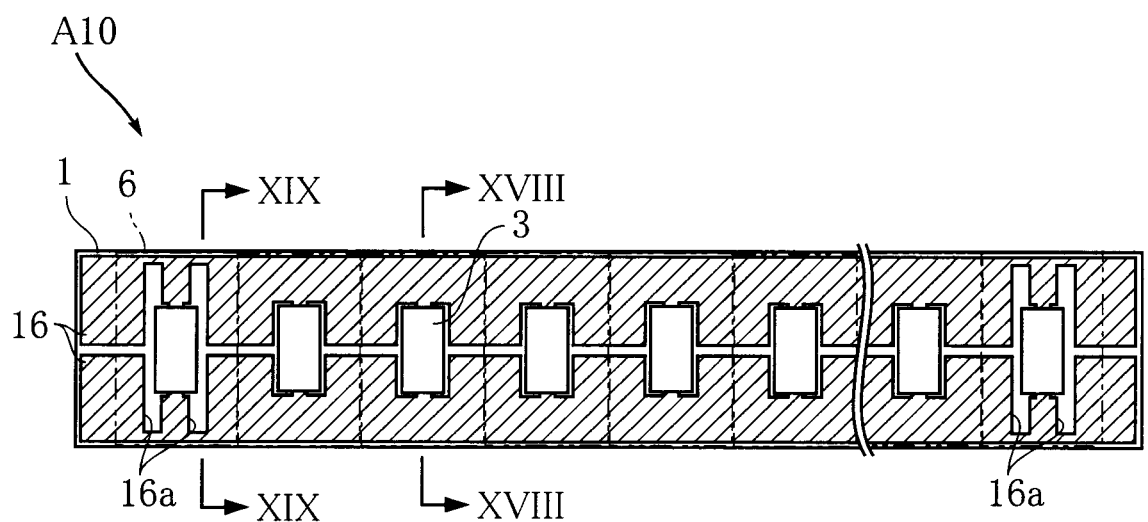
FIG. 17 is a plan view showing an LED lamp according to a tenth embodiment of the present invention.
Figure 18:
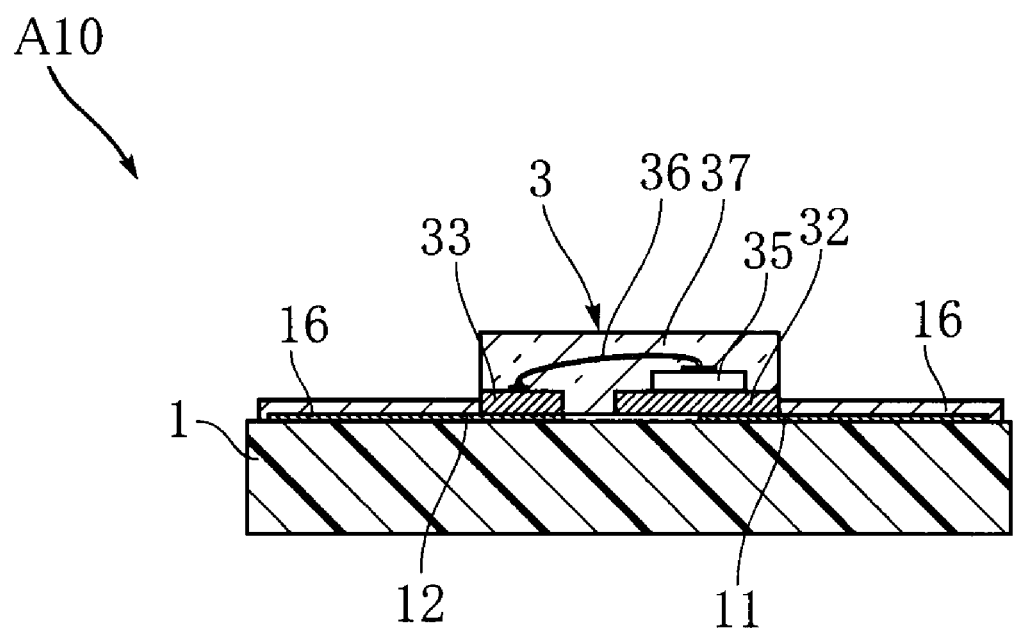
FIG. 18 is a sectional view taken along lines XVIII-XVIII in FIG. 17.
Figure 19:
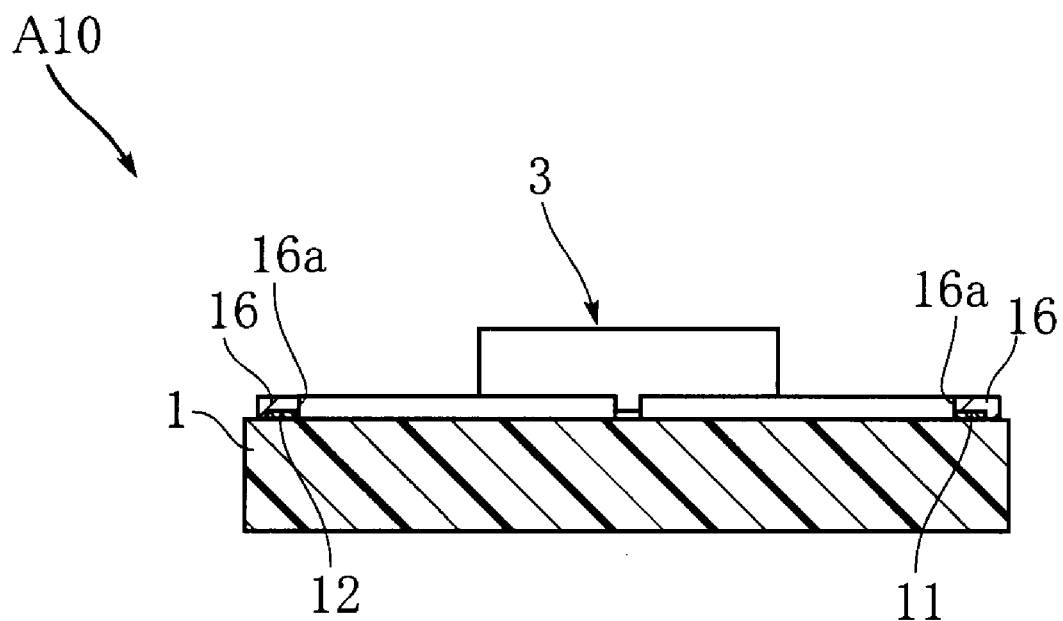
FIG. 19 is a sectional view taken along lines XIX-XIX in FIG. 17.

FIGS. 17-19 show an LED lamp according to a tenth embodiment of the present invention. The LED lamp A10 of this embodiment includes a board 1, LED modules 3 and a metal heat dissipation film 16.

The board 1 is made of e.g. a glass fiber-reinforced epoxy resin and in the form of an elongated rectangle. The board 1 is formed with metal wirings 11 and 12 electrically connected to the LED modules 3.

The LED modules 3 are arranged in the longitudinal direction of the board 1 at regular intervals. As shown in FIG. 18, each of the LED modules 3 includes an LED chip 35, leads 32 and 33 made of a metal and spaced from each other, a bonding wire 36 and a resin package 37. The LED lamp A10 is provided with a diffusion transmission cover (not shown) made of e.g. a milky white translucent resin. The light emitted from the LED modules 3 passes through the diffusion transmission cover in a diffusing manner. Thus, the LED lamp A10 illuminates the surroundings relatively uniformly.

The LED chip 35 may have a laminated structure made up of an n-type semiconductor layer, a p-type semiconductor layer and an active layer sandwiched between these layers. When the LED chip 35 is made of a GaN-based semiconductor, the LED chip emits blue light. The LED chip 35 is bonded to the lead 32. The upper surface of the LED chip 35 is connected to the lead 33 by the bonding wire 36. The leads 32 and 33 are connected to the metal wirings 11 and 12, respectively.

The resin package 37 protects the LED chip 35 and the bonding wire 36. The resin package 37 is made of e.g. an epoxy resin which transmits the light emitted from the LED chip 35. A fluorescent material which emits yellow light when excited by blue light may be mixed in the resin package 37. In this case, white light is emitted from the LED module 3. As the fluorescent material, use may be made of a mixture of a material which emits green light when excited by blue light and a material which emits red light when excited by blue light.

The metal heat dissipation film 16 is made of e.g. a metal having a high thermal conductivity and formed on the board 1 to cover the metal wirings 11 and 12. To prevent the direct electrical connection of the metal wirings 11 and 12, the metal heat dissipation film 12 is divided into two parts at the center of the substrate 1 in the width direction. In FIG. 17, the metal heat dissipation film 16 is divided by phantom lines into a plurality of regions 6. The regions 6 surround the LED modules 3, respectively, and have the same maximum size so as not to overlap each other.

The metal heat dissipation film 16 is made of e.g. Cu. The metal heat dissipation film 16 is formed with openings 16a exposing the surface of the board 1 at the regions 6 having the right and left extremity LED modules 3 spaced in the longitudinal direction. Each of the openings 16a is symmetrical, with the LED module 3 located at the center, in the longitudinal direction of the board 1. Due to the openings 16a, the area of the metal heat dissipation film 16 in the two extremity regions 6 in the longitudinal direction is smaller than that in the other regions 6.

The advantages of the LED lamp A10 are described below.

In the LED lamp A10, due to the presence of the openings 16a, the LED modules 3 at the two ends in the longitudinal direction are less cooled as compared with the other LED modules 3. At the same time, the extremity LED modules 3 in the longitudinal direction are less heated than the other LED modules 3, since only one LED module 3 exists next to them. Thus, in the LED lamp A10, the temperature difference between the LED modules 3 at the two ends in the longitudinal direction and the other LED modules 3 is small, so that the color of emitted light is uniformized and the life of the incorporated LEDs is also uniformized.

Figure 20:
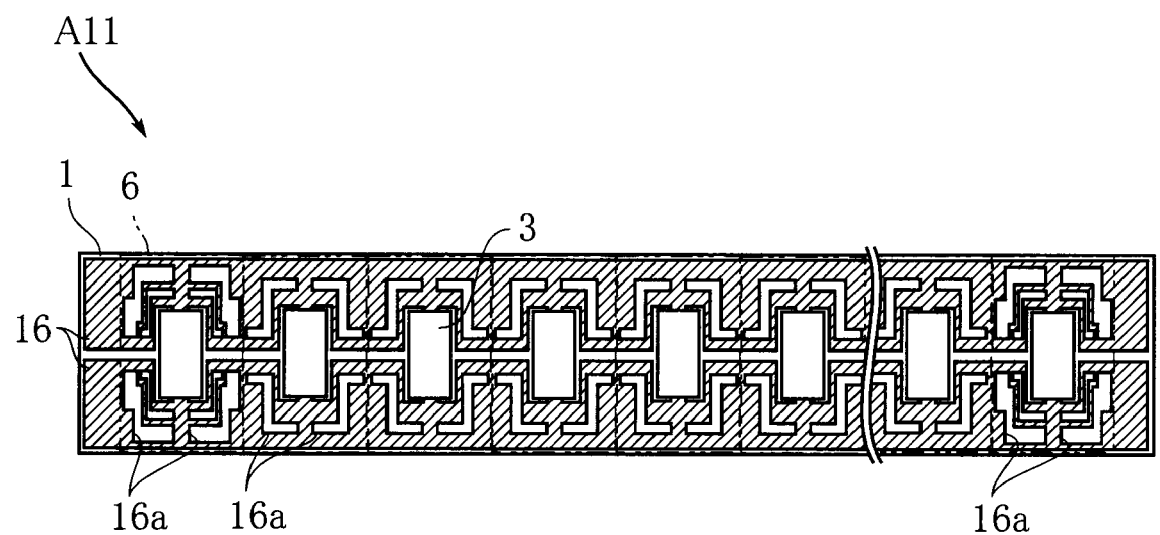
FIG. 20 is a plan view showing an LED lamp according to an eleventh embodiment of the present invention.
Figure 21:
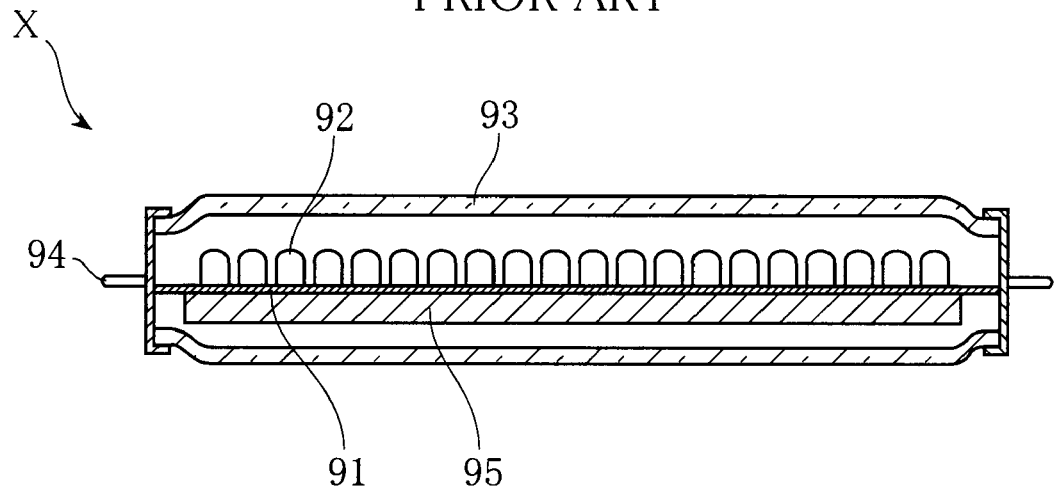
FIG. 21 is a sectional view showing a conventional LED lamp.

FIG. 20 shows an LED lamp according to an eleventh embodiment of the present invention. In FIG. 20, the elements which are identical or similar to those of the tenth embodiment are designated by the same reference signs as those used for the tenth embodiment. In the LED lamp A11 shown in FIG. 20, a plurality of openings 16a are arranged in the longitudinal direction. The structures of other parts are the same as those of the LED lamp A10.

All the openings 16a have the same shape except those formed in the two regions 6 at the two ends spaced in the longitudinal direction. The openings 16a in the two regions 6 at the ends spaced in the longitudinal direction have a larger area in plan view than the opening 16a in other regions 6.

In each of the regions 6, the opening 16a is symmetrical on two sides of the LED module 3. With this arrangement, the shape of the heat dissipation film 16 is symmetrical on two sides of the LED module 3 in each of the regions 6. Thus, the heat generated from the LED module 3 is dissipated uniformly from both sides of the LED module 3.

With the LED lamp A11 again, similarly to the LED lamp A10, the temperature difference between the LED modules 3 at the two ends in the longitudinal direction and other LED modules 3 is small. Thus, in the LED lamp A11, the color and the life of the incorporated LEDs can be made uniform.

The LED lamp according to the present invention is not limited to the foregoing embodiment. The specific structure of each part of the LED lamp according to the present invention may be varied in design in many ways. For instance, although the openings 16a are rectangular in plan view in the foregoing embodiment, the openings may have a shape defined by a curved line.

The invention claimed is:

1. An LED lamp comprising:
    a board;
    a pair of metal wirings provided on the board;
    an LED mounted on the metal wirings in a manner such that ends of the LED are supported by the metal wirings, respectively; and
    a pair of metal heat dissipation films held in direct contact with and partially overlapping the metal wirings, respectively, the metal heat dissipation films and the metal wirings containing different metals as main component, each of the metal heat dissipation film being formed of a thin film;
    wherein each of the metal heat dissipation films has an irregular surface formed with irregularities, the irregular surface having a surface roughness smaller than a thickness of the thin film.

2. The LED lamp according to claim 1, wherein the metal heat dissipation films are mainly made of a metal that is softer than the metal wirings.

3. The LED lamp according to claim 1, wherein the metal heat dissipation films intervene between the board and the metal wirings, respectively, and part of the irregular surface of each metal heat dissipation film is in contact with one of the metal wirings.

4. A method of making an LED lamp, the method comprising the steps of:
    forming a pair of metal wirings and a pair of metal heat dissipation films on a board in a manner such that the metal heat dissipation films are held in direct contact with and partially overlap the metal wirings, respectively; and
    mounting an LED on the metal wirings in a manner such that ends of the LED are supported by the metal wirings, respectively;
    wherein the formation of the metal heat dissipation films comprises: forming a thin film of a metal different from a metal for forming the metal wirings; and performing implantation with respect to the thin film to make a surface of the thin film irregular so that the irregular surface is formed with irregularities and has a surface roughness smaller than a thickness of the thin film.

5. The method of making an LED lamp according to claim 4, wherein the metal wirings are formed by using a material mainly made of Cu.

6. The method of making an LED lamp according to claim 4, wherein, in forming the metal heat dissipation films, an impurity is added to an aluminum film by implantation.

7. The method of making an LED lamp according to claim 6, wherein the impurity is selected from the group consisting of Ar, P and B.

* * * * *